United States Patent [19]
Flachenecker et al.

[11] Patent Number: 4,609,879
[45] Date of Patent: Sep. 2, 1986

[54] CIRCUITRY FOR A SELECTIVE PUSH-PULL AMPLIFIER

[76] Inventors: Gerhard Flachenecker, Bozener Strasse 2 De, D8012 Ottobrun; Karl Fastenmeier, Lutzelsteiner Strasse 7b, D-8000, Munich 45; Heinz Linenmeier, Furstenrei-er Strasse 7, D-8033 Planegg, all of Fed. Rep. of Germany

[21] Appl. No.: 515,292

[22] Filed: Jul. 19, 1983

[30] Foreign Application Priority Data

Jul. 20, 1982 [DE] Fed. Rep. of Germany ....... 3227109

[51] Int. Cl.$^4$ .............................................. H03F 3/26
[52] U.S. Cl. ..................................... 330/276; 330/262
[58] Field of Search ................ 330/262, 273, 276, 277

[56] References Cited
U.S. PATENT DOCUMENTS 4,167,709 9/1979 Papson ................................. 330/276

Primary Examiner—James B. Mullins
Assistant Examiner—G. Wan
Attorney, Agent, or Firm—Donald D. Mon

[57] ABSTRACT

A circuit for a selective push-pull amplifier having amplifier triple poles of the same polarity which simultaneously produces high efficiency and low nonlinear distortions. The circuit has control electrodes controlled by out-of-phase control voltages and an output inductance having a center tap which produces a magnetic combination of output currents of the amplifier triple poles. The output electrodes of each triple pole is connected to an output inductance through a transformer having three windings. Two oppositely polarity windings connect the output of the triple poles to the output inductance while the third winding is connected to provide a series resonant circuit.

11 Claims, 7 Drawing Figures

CIRCUITRY FOR A SELECTIVE PUSH-PULL AMPLIFIER

BACKGROUND OF THE INVENTION

The present invention relates to circuitry for a selective push-pull amplifier.

Push-pull amplifiers comprise two amplifier triple poles with the same operating voltage polarity, whose control electrodes are controlled in phase opposition and whose output currents are combined by means of an output inductance, the latter simultaneously serving as the operating voltage supply for the amplifier triple poles. The term "two amplifier triple poles with the same operating voltage polarity" is understood to mean, e.g. two electron tubes, which must always be operated with a positive anode voltage. Further examples are two pnp-transistors, which are both operated with negative collector-emitter voltage, or two npn-transistors, which are both operated with positive collector-emitter voltage. All other electronic amplifier elements, such as e.g. the different types of field effect transistors are to be considered in a similar way. Due to the same operating voltage polarity of the two amplifier triple poles, the operating currents thereof also have the same polarity. Thus, they must be combined in phase opposition at the amplifier output, in order to superimpose them in the correct phase position for the load. This is brought about by an output inductance or output transformer which, in per se known manner, brings about a magnetic combination of the output currents of the two amplifier triple poles. In per se known manner, the operating voltage is supplied to the two amplifier triple poles by a centre tap at the output inductance or in primary winding of the output transformer.

The amplifier controls can be operated in each of the three known basic circuits. This would be the emitter-base and collector circuit in the case of a bipolar transistor. In each of these circuits is defined a control electrode (e.g. the base in the bipolar transistor emitter circuit) and an output electrode (e.g. the collector in the bipolar transistor emitter circuit) of the amplifier triple pole. Any known variant of the three basic circuits is conceivable for the amplifier triple poles, such as e.g. the emitter circuit with emitter resistance to current feedback.

Amplifiers are generally classified according to the control mode of their triple poles (e.g. tubes, transistors, FET's). The literature (cf. e.g. MEINKE-GUNDLACH, Taschenbuch der Hochfrequenztechnik, 3rd edition, Springer-Verlag: chapter O, transmitter amplifiers and neutralization) discloses A, B and C amplifiers. These classifications apply to wide-band amplifiers and selective (narrow-band) amplifiers both in single-ended and push-pull operation (cf. e.g. H. SCHRÖDER, Elektrische Nachrichtentechnik, Verlag für Radio-Foto-Kinotechnik, Berlin: vol. II, chapter BIII/9, Push-pull circuits). The following comments are limited to push-pull amplifiers according to the preamble of claim 1.

The three amplifier classes differ fundamentally in their behaviour mainly with respect to the efficiency attainable and the nonlinear distortions which occur.

In the case of A amplifiers the efficiency $\eta$ is always below 50%, but they have the lowest nonlinear distortions. The low efficiency can be attributed to the fact that the amplifier triple poles carry current at all times and consequently there is always a power dissipation therein.

However, in B amplifiers a half-wave control is used, so that each triple pole is alternately free from current for a half-cycle of the instantaneous frequency. At these times, in which there is only voltage at the particular amplifier triple pole, but no current flows through it, no power dissipation is produced therein. Thus, the efficiency $\eta$ can be increased to max. 78.5%. However, compared with the A amplifier, the B amplifier has higher nonlinear distortions.

Finally, in the C amplifier, the control of the amplifier triple poles is limited to fractions of a half-cycle of the instantaneous frequency. Thus, the current-carrying times for the amplifier triple poles are further reduced compared with B amplifiers and the power dissipation in the triple poles is further reduced. However, in the now very short current-carrying phases, the amplifier triple poles must carry much higher currents than in the case of A or B amplifiers. In the extreme case, the current-carrying phase of the amplifier triple poles is reduced to zero. The efficiency can then become 100% in theory, but it will be necessary for the amplifier triple poles to supply infinitely high current pulses as in infinitely short time. These extreme values cannot be achieved in practice.

Thus, in the case of C amplifiers, each move towards a 100% efficiency must be bought with a great increase in the peak currents in the amplifier triple poles compared with the output currents to be effectively supplied by the amplifier. This requires greatly overdimensioned components which, due to the necessary short switching times, are usually very expensive and do not permit an economically favourable solution.

In addition, the harmonic frequency proportions increase in the current pulses with decreasing time and consequently increasing amplitude. Thus, in the C amplifier, an efficiency increase also leads to a further increase in the nonlinear distortions in the form of subsidiary waves or rising distortion factor. This effect can only be reduced by the increased filtering out of the harmonics. However, on increasing the filtering action, e.g. through reducing the band width, the filter losses increase, so that the efficiency of the circuit again drops.

Therefore the known A, B and C amplifiers are not in a position to simultaneously bring about high efficiency at minimum distortion. However, many applications exist where both requirements must be simultaneously fulfilled. For example, in the case of transmitter amplifiers, the minimum possible nonlinear distortions are required, due to the high subsidiary wave damping required in the case of transmitters. However, the efficiency must also be as high as possible, so that with a high transmission power, the dissipation remains as low as possible. As both requirements cannot be jointly fulfilled by any of the known amplifier circuits, it is generally necessary to accept a low efficiency in order to achieve an adequately low nonlinear distortion level.

SUMMARY OF THE INVENTION

The problem of the invention is to provide circuitry for a selective push-pull amplifier, which simultaneously brings about high efficiency and low nonlinear distortions. The invention is also intended to obviate the described disadvantage of the hitherto known amplifiers that on dimensioning for high efficiency (C amplifiers), the amplifier triple poles must supply very short current pulses with very high peak values, which leads to a necessary overdimensioning of the triple poles with respect to the current-carrying capacity and disconnection behaviour and consequently to more expensive components.

According to the invention this problem is solved by the characterizing measures proposed in the claims.

In the circuitry according to the invention, between the output electrodes of the two amplifier triple poles and the connections of the output inductance are connected two windings of a transformer which has three windings. These two windings have opposite winding directions with respect to their connections to the output electrodes of the amplifier triple poles, or to the output inductance. The third winding of this transformer is wired with a series resonant circuit of an inductance and a capacitance of dimensions such that in the circuit, said third winding, together with the leakage inductance of the transformer, gives a series resonance, which roughly corresponds to the average operating frequency of the selective amplifier. Thus, together with its external wiring, the third winding represents for the transformer a short-circuit on the average operating frequency of the amplifier and in the magnetic flow of the transformer prevents all frequency components in the frequency range of the series resonance of the third transformer winding, i.e. in the range of the average operating frequency of the amplifier. Thus, in the average operating frequency, the transformer has at its first and second windings a low impedance, which in the ideal case can be looked upon as a short-circuit. Due to the antiphase connection of the first and second windings, the transformer also has low impedance behaviour for all frequency components of the difference of the output currents of the two amplifier triple poles, in the range of the average operating frequency of the amplifier. Thus, if the two amplifier triple poles are e.g. controlled in such a way that they in each case carry an antiphase half-sine-wave current of the same polarity, said half-sine-waves are added together in the difference to a sine-wave current of the operating frequency, which passes uninfluenced through the transformer. For all other frequencies, particularly also the multiple of the average operating frequency of the amplifier, the circuit to which the third transformer winding belongs is of a high impedance nature. For these frequencies, the two first windings of the transformer also have a high impedance behaviour. Thus, in the difference of the output currents of the two amplifier triple poles there are no frequencies other than roughly the operating frequency of the amplifier. In other words, the transformer ensures that the difference of the output currents of the two amplifier triple poles is sinusoidal.

The forced sine-wave current in the difference of the output currents also flows if the amplifier triple poles are in each case completely conductive for a half-cycle, i.e. represent a short-circuit in push-pull for in each case one half-cycle of the operating frequency. The voltage at the amplifier triple poles is then virtually zero in the particular half-cycles. If the amplifier triple poles in the in each case other half of the cycle are completely non-conductive, then no current can flow through the particular triple pole during this time. Thus, the state is reached that the two amplifier triple poles in each case only carry an almost exact half-sine-wave current for a half-cycle, whilst in the same half-cycle no voltage appears at said triple pole, i.e. there is no power dissipation. The particular amplifier triple pole is blocked in the in each case other half-cycle. No current flows for as long as there is voltage at the amplifier triple pole. Thus, also in this half-cycle there is no power dissipation.

The two half-sine-waves are combined to an extremely low-distortion sine-wave oscillation in the output inductance.

Another advantage of the present circuitry is that the current-carrying capacity of the amplifier triple poles is only as large as the requisite output current of the amplifier. There are no current pulses with excessive amplitudes, as in the case of C amplifiers. Another advantage of this circuitry are the simplified switching requirements on the amplifier triple poles used. At the moment of disconnection, i.e. at the end of the current-carrying half-cycle of the particular amplifier triple pole, the current from the transformer is forced through zero. Storage effects and disconnection delays, such as are known e.g. with bipolar transistors have only limited significance.

The above explanation has related to ideal conditions, i.e. a leakage-free, non-dissipative transformer, non-dissipative reactive elements in the series resonant circuit and ideal controllable amplifier triple poles, but such conditions do not occur in practice. Thus, in practical realizations of the circuitry absolute non-dissipative and leakage-free conditions are not achieved. However, much lower losses and distortions are obtained than in a C amplifier.

Further advantageous developments can be gathered from the characterizing features of the subclaims. It can be advantageous for coupling a load impedance to supplement the output inductance with an additional winding to form an output transformer. In addition, the non-linear distortions of the selective push-pull amplifier can be further reduced, if the output inductance or the primary winding of the output transformer, or the secondary winding of the output transformer is supplemented by a capacitor of appropriate size to give a parallel resonant circuit, in such a way that the resonant frequency thereof approximately corresponds to the average operating frequency of the amplifier.

If the output inductance or the primary or secondary winding of the output transformer is operated together with a capacitor as a parallel resonant circuit, this leads to a particularly advantageous construction of the invention, if said capacitor is dimensioned in such a way that at the average operating frequency of the amplifier, roughtly the same reactive power is converted therein as in the capacitor which, together with the series inductance and the leakage inductance of the transformer according to the invention, produces a series resonance at roughly the amplifier operating frequency. With this dimensioning, within the amplifier frequency response, the circuitry has a particularly frequency-independent behaviour. Furthermore, with this dimensioning, component tolerances have least effect in the described behaviour of the circuitry.

The advantages of the present circuitry become particularly clear if the amplifier triple poles in push-pull are completely conductive for one half of the cycle time of the instantaneous operating frequency and are non-conductive for the other half thereof. This can be achieved by a suitable choice of the control voltages for the amplifier triple poles in per se known manner. Thus, for example, the control voltages for the triple poles can be approximately rectangular or sinusoidal.

DESCRIPTION OF THE DRAWINGS AND PREFERRED EMBODIMENTS

To further illustrate the invention, FIGS. 1 to 6 show a number of developments of the circuitry and typical time responses of currents and voltages in said circuitry.

FIG. 1 shows the principle of the circuitry. The amplifier triple poles 1 and 2 are in this case assumed to be e.g. bipolar pnp-transistors in a collector circuit. However, it is possible to use other known amplifier triple poles in each of the known basic circuits. In the present example, the control electrodes 3 and 4 are the bases and the output electrodes 5 and 6 the emitters of the two transistors. The third connections of the amplifier triple poles, in this case, the collectors, are connected to earth. It is expressly pointed out that it is naturally possible to use all other known basic circuit variants for the circuit of the amplifier triple poles, e.g. for negative feedback purposes. The output inductance 9 selected in the present embodiment is used for the magnetic combination of the output currents of the two amplifier triple poles. The output inductance has the two terminals 10 and 11 and the centre tap 12. The operating voltage source 13 supplying the operating voltage $U_B$ is connected to the centre tap 12. The load resistor 22 is in the present case connected in parallel with the output inductance.

According to the invention, between the output electrodes 5, 6 of the amplifier triple poles 1, 2 and terminals 10, 11 of output inductance 9, transformer 14 with the three windings 15, 16, 17 is connected such that two of the windings, opposite in polarity are connected to the output electrode of each triple pole while the third winding forms part of a resonant circuit. The third winding 17 is connected to the series resonant circuit of inductance 18 and capacitor 19. The points at the ends of windings 15 and 16 of transformer 14 give the winding direction of the windings with respect to their connections. At these points, it is possible to see the opposite winding direction of windings 15 and 16.

FIG. 2 shows the most important currents and voltages from the circuitry of FIG. 1. It is assumed that the control voltages for the amplifier triple poles are selected in such a way that said triple poles are in push-pull operation alternately conductive for one half of the cycle and non-conductive for the other half. Due to the characteristics of the circuitry, there are almost rectangular voltage curves at the amplifier triple poles, with the extreme values zero and $2*U_B$. These voltage curves are given in FIG. 2, whilst using connection points $u_{5,7}$ for the amplifier triple pole 1 and $u_{6,8}$ for amplifier triple pole 2.

As in the difference of the currents flowing through the amplifier triple poles, the circuitry only allows components of the fundamental wave (average amplifier operating frequency), but in each case current can only flow in half of the cycle time in the triple poles, the current $i_5$ through triple pole 1 and $i_6$ through triple pole 2 are exact sine-half-waves. Each of these currents automatically passes to zero at the time of the disconnection of the associated triple pole, so that the known disconnection problems lose significance.

A comparison of the current and voltage curves of the two amplifier triple poles shows that there is no power dissipation under these ideal conditions, because at the triple poles voltage and current never simultaneously differ from zero.

FIG. 2 also shows the voltage $u_{15}$ for winding 15 at transformer 14. A Fourier analysis of this voltage curve shows that there are no fundamental wave components in this voltage. The current $i_{17}$ flowing through the series resonant circuit and winding 17 of transformer 14, represents the difference of currents $i_5$ and $i_6$. Output voltages $u_{10}$ and $u_{11}$, which together give the voltage at the load resistor 22, are purely sinusoidal.

Further advantageous constructions of the circuitry can be gathered from the remaining drawings relating to the characterizing parts of the subclaims.

FIG. 3 shows the supplementing of the output inductance 9 by a secondary winding 20 to give an output transformer 21 for the coupling of the load resistor 22.

Figure 1:
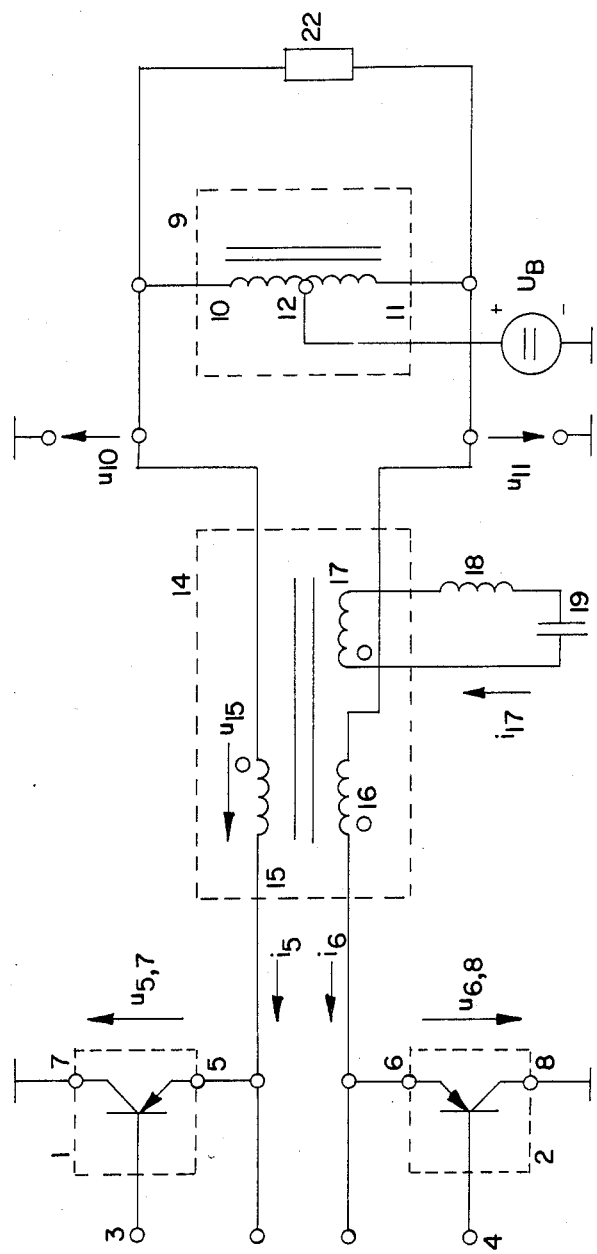
Figure 2:
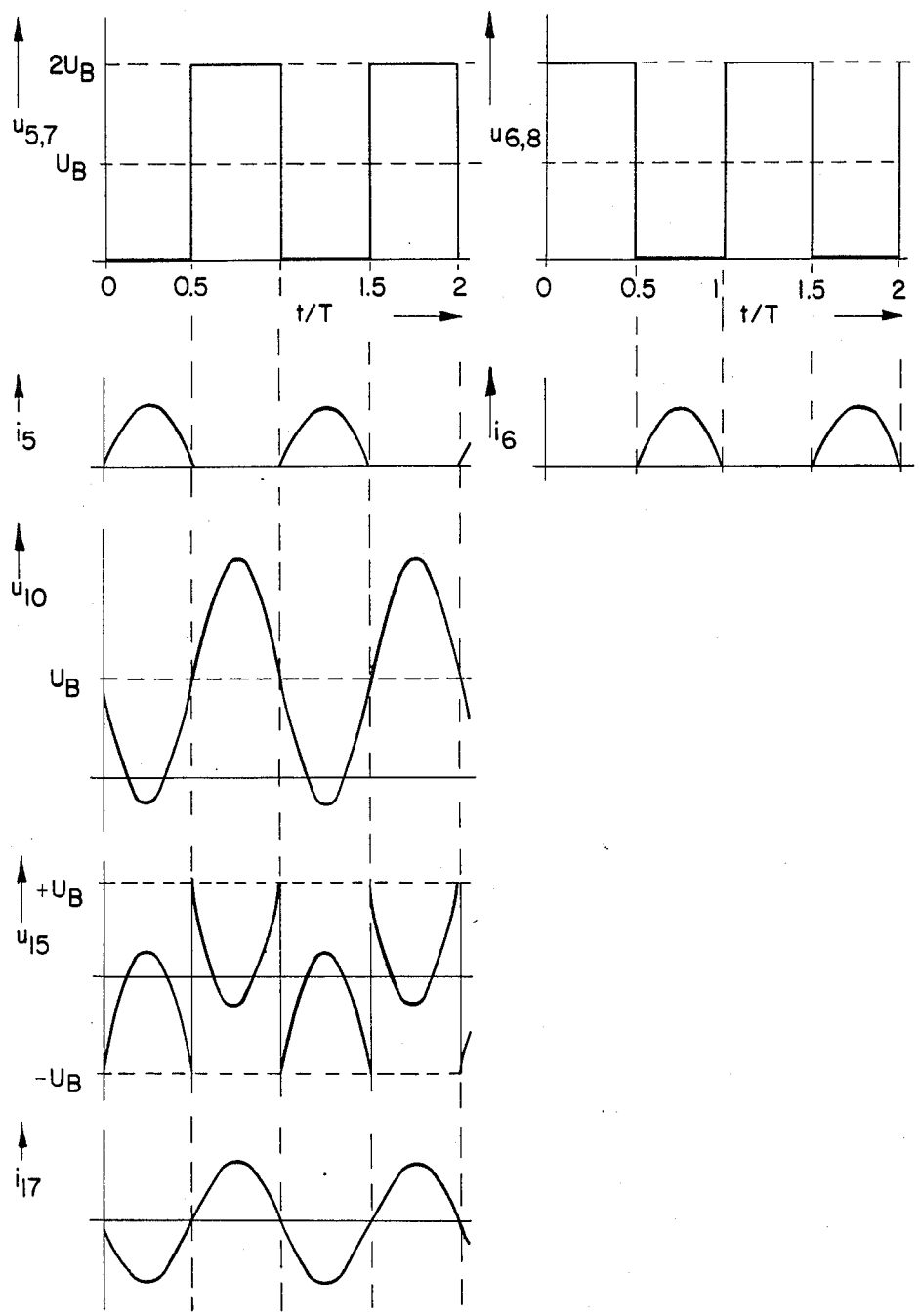
Figure 3:
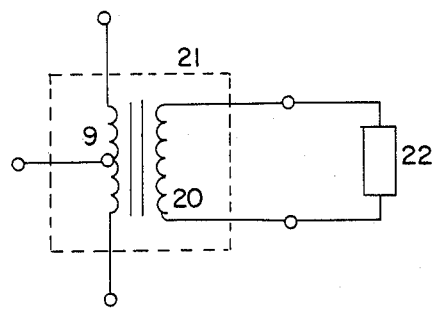
Figure 4:
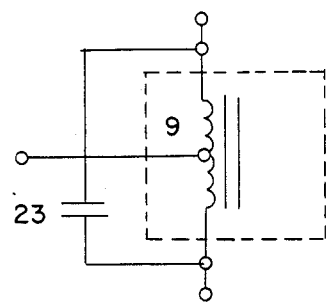
FIG. 4 shows the supplementing of the output inductance 9 with a capacitor 23 to form a parallel resonant circuit.
Figure 5:
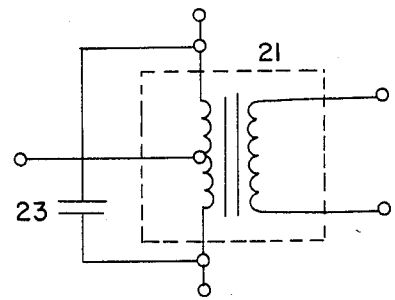
FIG. 5 shows the supplementing of the primary winding of an output transformer 21 with a capacitor 23 to give a parallel resonant circuit.
Figure 6:
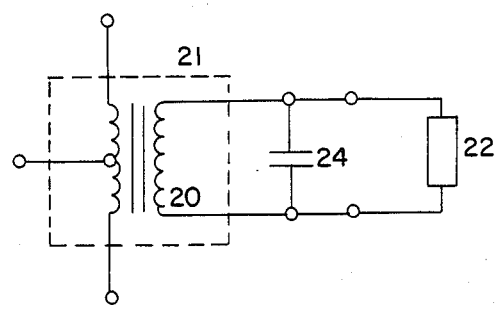
FIG. 6 shows the supplementing of the secondary winding of an output transformer 21 with a capacitor 24 to give a parallel resonant circuit.
Figure 7:
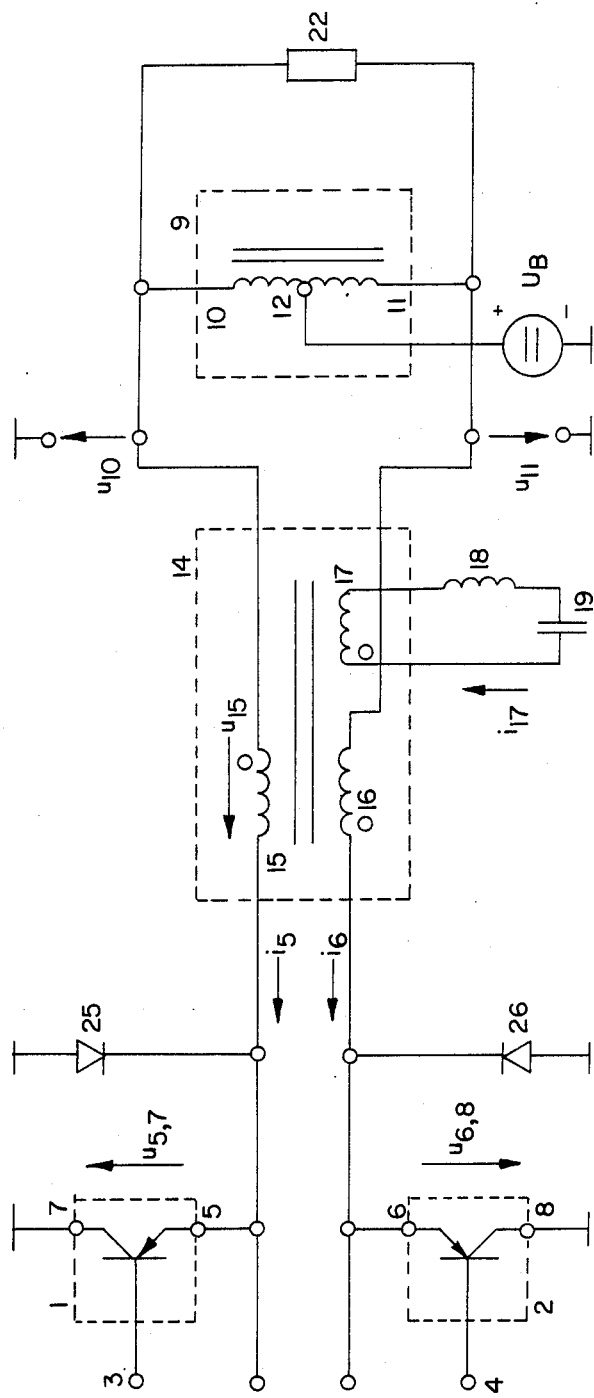

According to a further advantageous development of the invention, a diode is connected in parallel with each of the two amplifier triple poles in such a way that each of the said diodes is poled with the correct operating voltage polarity in the blocking direction under normal polarity conditions of the amplifier triple poles. This construction of the invention is shown in FIG. 7 with diodes 25 and 26. For as long as the collector voltages of the pnp-transistor shown in this embodiment are negative, i.e. have the normal operating voltage polarity, the two diodes are blocked. The advantage of this construction is that the purely sinusoidal differential current in the two first windings 15, 16 of transformer 14 can still flow if the two amplifier triple poles are not precisely connected in push-pull to block and conduct. In particular, with this construction of the invention, it is possible for there to be short time periods in which both amplifier triple poles are simultaneously non-conductive between the current-carrying times thereof. In these time periods, the continuous current forced by the transformer 14 is derived from the two diodes.

According to another advantageous development of the invention, whose prerequisite is the use of diodes 25 and 26, the control voltages for the two amplifier triple poles are such that in push-pull, each of these two triple poles is alternately conductive for somewhat less than half the cycle time of the instantaneous operating frequency and non-conductive for the remainder of this time. Between the current-carrying times of the two amplifier triple poles, there are short time periods, during which both poles are non-conductive. In this construction, the requirements regarding the precision in the time curve of the control voltages are particularly low, which leads to inexpensive solutions for the control circuit. In addition, the requirements regarding the disconnection behaviour of the amplifier triple poles are further reduced.

What is claimed is:

1. A circuit for a selective push-pull amplifier comprising;
    two amplifier triple poles having the same operating voltage polarity, said two amplifier triple poles each having a control electrode and an output electrode;
    said control electrodes being controlled by out of phase control voltages;

an output inductance having a pair of terminals at each end and a center tap for producing a magnetic combination of output currents of said two amplifier triple poles;

a transformer connected between the output electrodes of said amplifier triple poles and said pair of terminals of said output inductance;

said transformer having three windings with two windings each being connected in series between said amplifier triple pole output electrodes and said pair of terminals of said output inductance;

said two windings being of opposite polarity;

the third winding of said transformer being wired in a series resonant circuit comprised of an inductance, a capacitance and leakage inductance of said transformer;

said series resonant circuit constructed to have a resonant frequency approximately equal to the average operating frequency of said amplifier.

2. A circuit according to claim 1 in which said output inductance includes a secondary winding providing an output transformer coupling at load impedance.

3. A circuit according to claim 1 or 2 in which said output inductance includes a shunt capacitor providing a parallel resonant circuit having a resonant frequency approximately equal to the operating frequency of said amplifier.

4. A circuit according to claim 3 in which said capacitor connected to said third winding of said transformer and said shunt capacitor connected in parallel with said inductance are selected to produce approximately equal large reactive power levels at the average operating frequency of said amplifier.

5. A circuit according to claim 2 in which said secondary winding of said output transformer includes a shunt capacitor providing a parallel resonant circuit having a resonant frequency approximately equal to the average operating frequency of said amplifier.

6. A circuit according to claims 2 including a diode connected in parallel with each of said triple poles such that each diode operates as a blocking diode during normal polarity of said amplifier triple poles.

7. A circuit according to claim 6 including means for supplying control voltages to the control electrodes of said amplifier triple poles such that said amplifier triple poles in push-pull operations are alternatively conductive for somewhat less than half of a cycle time of the instantaneous operating voltage and are non-conductive for the remainder of this time, such that said two amplifier triple poles are non-conductive for short time intervals between current-carrying times thereof.

8. A circuit according to claim 7 including means for supplying control voltages to the control electrodes of said two amplifier triple poles such that said two triple poles in push-pull operation are alternatively conductive for half the cycle time of the instantaneous operating frequency and are non-conductive for the other half thereof.

9. A circuit according to claim 8 in which said control voltages are approximately sinusoidal voltages.

10. A circuit according to claim 8 in which said control voltages are approximately rectangular control voltages.

11. A circuit according to claim 1 in which said control electrodes are controlled by antiphase control voltages.

* * * * *